United States Patent
Lee et al.

(10) Patent No.: US 9,236,549 B2
(45) Date of Patent: Jan. 12, 2016

(54) HEAT CONDUCTING SLUG HAVING MULTI-STEP STRUCTURE AND LIGHT EMITTING DIODE PACKAGE USING THE SAME

(75) Inventors: Jong Kook Lee, Ansan-si (KR); Byoung Ki Pyo, Ansan-si (KR); Hyuck Jung Choi, Ansan-si (KR); Kyung Nam Kim, Ansan-si (KR); Won Cho, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 781 days.

(21) Appl. No.: 12/519,954

(22) PCT Filed: Dec. 18, 2007

(86) PCT No.: PCT/KR2007/006619
§ 371 (c)(1),
(2), (4) Date: Jun. 18, 2009

(87) PCT Pub. No.: WO2008/075873
PCT Pub. Date: Jun. 26, 2008

(65) Prior Publication Data
US 2010/0091504 A1    Apr. 15, 2010

(30) Foreign Application Priority Data
Dec. 19, 2006  (KR) .................. 10-2006-0129864

(51) Int. Cl.
*F21V 29/00* (2015.01)
*H01L 33/64* (2010.01)
(Continued)

(52) U.S. Cl.
CPC ........ *H01L 33/642* (2013.01); *B29C 45/14655* (2013.01); *B29C 45/2669* (2013.01);
(Continued)

(58) Field of Classification Search
CPC .................................................. H01L 2924/00
USPC ............... 362/294, 373, 235, 249.01, 249.02, 362/249.06; 257/99
See application file for complete search history.

(56) References Cited

U.S. PATENT DOCUMENTS 5,650,663 A    7/1997  Parthasarathi
5,933,709 A *  8/1999  Chun ........................... 438/122
(Continued)

FOREIGN PATENT DOCUMENTS

CN    2831425       10/2006
JP    2002-353515   12/2002
(Continued)

OTHER PUBLICATIONS

Non-Final Office dated Jan. 17, 2012 issued in co-pending U.S. Appl. No. 13/302,450.
(Continued)

*Primary Examiner* — Anh Mai
*Assistant Examiner* — Jessica M Apenteng
(74) *Attorney, Agent, or Firm* — H.C. Park & Associates, PLC

(57) ABSTRACT

The present invention provides a heat conducting slug having a multi-step structure, which is installed to an LED package to dissipate heat generated from a light emitting chip to the outside. The heat conducting slug includes a first slug, a second slug formed on the first slug, and a third slug formed on the second slug, wherein the light emitting chip is mounted to the third slug, and the second and third slugs respectively shaped to have edges are arranged to cross each other. In this configuration, heat generated from a light emitting chip follows a heat dissipation path, in which the heat is gathered at edges of one slug and dissipated therefrom and then gathered toward edges of another slug, arranged to cross the one slug. Accordingly, the entire heat dissipation path is not concentrated at a specific region but generally distributed widely, thereby improving a heat dissipation effect of the heat conducting slug.

26 Claims, 4 Drawing Sheets

(51) Int. Cl.
    *B29C 45/14* (2006.01)
    *B29C 45/26* (2006.01)
    *B29C 45/34* (2006.01)

(52) U.S. Cl.
    CPC ........... *B29C45/34* (2013.01); *B29C 45/14836* (2013.01); *B29K 2995/0013* (2013.01); *H01L 33/647* (2013.01); *H01L 2924/0002* (2013.01)

(56) References Cited

U.S. PATENT DOCUMENTS

| | | | |
|---|---|---|---|
| 5,963,795 A * | 10/1999 | Schneider et al. | 438/122 |
| 6,166,435 A * | 12/2000 | Leu et al. | 257/704 |
| 6,188,130 B1 * | 2/2001 | Ramirez et al. | 257/706 |
| 6,190,945 B1 * | 2/2001 | Akram | 438/122 |
| 6,274,924 B1 * | 8/2001 | Carey et al. | 257/676 |
| 7,361,940 B2 | 4/2008 | Kim et al. | |
| 7,582,951 B2 * | 9/2009 | Zhao et al. | 257/660 |
| 2003/0230977 A1 | 12/2003 | Epstein | |
| 2004/0027067 A1 | 2/2004 | Song et al. | |
| 2004/0140543 A1 * | 7/2004 | Elpedes et al. | 257/676 |
| 2005/0135105 A1 | 6/2005 | Teixeira et al. | |
| 2006/0086945 A1 | 4/2006 | Wang et al. | |
| 2006/0267036 A1 * | 11/2006 | Lee et al. | 257/98 |
| 2006/0273338 A1 | 12/2006 | Lee et al. | |
| 2008/0121921 A1 | 5/2008 | Loh et al. | |

FOREIGN PATENT DOCUMENTS

| | | |
|---|---|---|
| JP | 2004-128433 | 4/2004 |
| JP | 2004-165308 | 6/2004 |
| JP | 3109109 | 3/2005 |
| JP | 2005-183993 | 7/2005 |
| JP | 2005-338251 | 12/2005 |
| JP | 2006-173561 | 6/2006 |
| JP | 2006-339639 | 12/2006 |
| JP | 2006-339653 | 12/2006 |
| KR | 10-2006-0002327 | 1/2006 |
| KR | 10-0593945 | 6/2006 |

OTHER PUBLICATIONS

Extended European Search Report issued on Mar. 12, 2012 for Application No. PCT/KR2007006619.

Non-Final Office Action issued in U.S. Appl. No. 13/302,450 on Sep. 26, 2012.

Non-Final Office Action issued on Jul. 9, 2013 in U.S. Appl. No. 13/302,450.

Chinese Office Action issued on Apr. 23, 2014 in Chinese Patent Application No. 201110168941.2.

Final Office Action issued Sep. 19, 2014, in U.S. Appl. No. 13/302,450.

* cited by examiner

US 9,236,549 B2

HEAT CONDUCTING SLUG HAVING MULTI-STEP STRUCTURE AND LIGHT EMITTING DIODE PACKAGE USING THE SAME

CROSS-REFERENCE TO RELATED APPLICATIONS

This application is the National Stage of International Application No. PCT/KR2007/006619, filed Dec. 18, 2007, and claims priority from and the benefit of Korean Patent Application No. 10-2006-0129864, filed on Dec. 19, 2006, which are both hereby incorporated by reference for all purposes as if fully set forth herein.

BACKGROUND OF THE INVENTION

1. Field of the Invention

The present invention relates to a light emitting diode (LED) package having an improved heat dissipation efficiency, and more particularly, to a heat conducting slug having a multi-step structure, wherein a slug structure of an LED package is configured into a multi-step structure so that heat generated from a light emitting chip is efficiently dissipated, and an LED package using the heat conducting slug.

2. Discussion of the Background

In recent years, an interest in lighting devices using an LED chip tends to increase. In order to use such an LED for lighting purpose, luminous power over several thousand lumens (where 1 lumen is a luminous flux emitted from a light source of one candela per a unit solid angle) is required in addition to improved quality of light emission. Such a high power light emission is in proportion to the input current, so that high current may give a required luminous power. However, if the input current is increased, a large amount of heat is generated accordingly.

A large amount of heat generated from the light emitting chip has fatal influence on the life span of the light emitting chip. In order to solve the problem, an LED package having a heat dissipation member such as a slug is manufactured.

Conventionally, in order to improve a heat dissipation effect of a slug, there has been an attempt to change the material and size of the slug. However, there is a limit in changing the material and size of the slug, and thus, other studies for enhancing a heat dissipation effect of a slug are needed.

Meanwhile, among conventional LED packages, there is an LED package having a molding member formed by casting molding, wherein a molding member is formed by mounting a slug in a housing, bringing an additional mold into close contact therewith while a light emitting chip is mounted in the slug, and then injecting a liquid resin into the mold.

However, since the liquid resin is injected at high pressure into the mold in the conventional technique, the mold may not be in close contact with the housing but be separated due to the pressure in the mold. In a case where the mold is separated from the housing when the liquid resin is injected into the mold, the mold cannot be in close contact with the housing again, thereby making it impossible to form a molding member, which causes product failures. In addition, even though the mold is in close contact with the housing again, the liquid resin in the mold may leak out through a gap generated by the separation between the mold and the housing, thereby resulting in product failures.

In addition, in a case where a slug is mounted after the housing is formed, the slug is separated from the LED package, which may cause device failures. Such device failures cause disconnection of wire, which makes it impossible to use the LED package again. Thus, it is required to assemble a slug and a housing such that the slug is not separated from the LED package.

SUMMARY OF THE INVENTION

The present invention is conceived to solve the problems of conventional LED packages. An object of the present invention is to provide a heat conducting slug, in which a heat dissipation effect can be improved, and an LED package using the slug.

Another object of the present invention is to provide an LED package, wherein the rate of failures occurring when forming a molding member of the LED package can be reduced and a superior luminous efficiency is ensured.

A further object of the present invention is to provide an LED package, wherein a slug can be prevented from being separated from a housing.

According to an aspect of the present invention for achieving the objects, there is provided a heat conducting slug having a multi-step structure, which is installed to a light emitting diode (LED) package to dissipate heat generated from a light emitting chip to the outside.

The heat conducting slug comprises a first slug; a second slug arranged on the first slug; and a third slug arranged on the second slug. The second slug and the third slug are respectively shaped to have edges, and the edges of the second and third slugs are arranged to cross each other.

According to one embodiment, each of the second and third slugs may have a rectangular rim, the rectangular rim of the third slug may be positioned within the rectangular rim of the second slug, and the rectangular rim of the third slug may be arranged to be rotated 45 degrees with respect to the rectangular rim of the second slug.

The third slug may be formed with a concave portion on which the light emitting chip is mounted. In addition, the third slug may have a reflective surface on the concave portion so that the light emitted from the light emitting chip is reflected thereon.

According to one embodiment, the first, second and third slugs may be monolithically formed.

In addition, the third slug may have a concave portion so that the light emitting chip is mounted thereon. The concave portion may be limitedly positioned within the third slug, but the present invention is not limited thereto. That is, the concave portion may extend to the second slug, whereby a bottom surface of the concave portion is positioned within the second slug.

In the meantime, the first slug may have a lead accepting step to which lead terminals are coupled. The lead accepting step may be continuously formed along a circumference of the first slug, but the present invention is not limited thereto. The lead accepting step may be discontinuously formed in several positions.

According to another aspect of the present invention, there is provided an LED package. The LED package comprises a housing; a heat conducting slug having a multi-step structure mounted in the housing; a light emitting chip mounted to the heat conducting slug; and lead terminals for supplying power to the light emitting chip. In addition, the heat conducting slug having a multi-step structure includes a first slug; a second slug formed on the first slug; and a third slug formed on the second slug. The second slug and the third slug are respectively shaped to have edges, and the edges of the second and third slugs are arranged to cross each other.

According to one embodiment, each of the second and third slugs may have a rectangular rim, the rectangular rim of the third slug may be positioned within the rectangular rim of the second slug, and the rectangular rim of the third slug may be arranged to be rotated 45 degrees with respect to the rectangular rim of the second slug.

The third slug may be formed with a concave portion on which the light emitting chip is mounted. In addition, the third slug may have a reflective surface on the concave portion so that the light emitted from the light emitting chip is reflected thereon.

In the meantime, the first, second and third slugs may be monolithically formed.

The third slug may have a concave portion so that the light emitting chip is mounted thereon, and the concave portion may extend to the second slug, whereby a bottom surface of the concave portion is positioned within the second slug.

According to one embodiment, the LED package may further comprise support leads. The support leads are coupled to the heat conducting slug.

In addition, the first slug may have a lead accepting step, and the support leads may be coupled to the lead accepting step.

In the meantime, at least one of the lead terminals may be coupled and electrically connected to the heat conducting slug, and at least another one of the lead terminals may be spaced apart from the heat conducting slug.

In addition, at least one of the lead terminals may be coupled to the lead accepting step of the first slug.

Further, the support leads may extend to form a semicircular support ring coupled to the first slug along a circumference of the first slug, and the semicircular support ring may be arranged to face at least one of the lead terminals.

In the meantime, at least one groove may be formed on an upper portion of the housing so that the groove is filled with a liquid resin leaking while the molding member is formed.

According to the present invention, a heat conducting slug for heat dissipation has a multi-step structure shaped to have edges. The slugs having a multi-step structure respectively have rectangular rim structures, which cross with each other, for example, by 45 degrees. In this configuration, heat generated from a light emitting chip follows a heat dissipation path, in which the heat is gathered at edges of one slug and dissipated therefrom and then gathered toward edges of another slug, arranged to cross the one slug by 45 degrees. Accordingly, the entire heat dissipation path is not concentrated at a specific region but widely distributed, thereby improving a heat dissipation effect of the heat conducting slug.

In addition, support leads or lead terminals are coupled to the heat conducting slug to prevent the heat conducting slug from being separated from a housing, and also the lead terminals may be electrically connected to a light emitting chip with ease.

Further, a groove is formed in an upper portion of the housing, so that even though a liquid resin leaks out of a mold since an inner pressure of the mold is increased over a normal level when a molding member is formed by a cast molding method, the groove formed in the housing is filled with the leaking liquid resin. Thus, it is possible to lower the inner pressure of the mold and to prevent the leaking liquid resin from flowing out of the housing.

DETAILED DESCRIPTION OF THE ILLUSTRATED EMBODIMENTS

Figure 1:
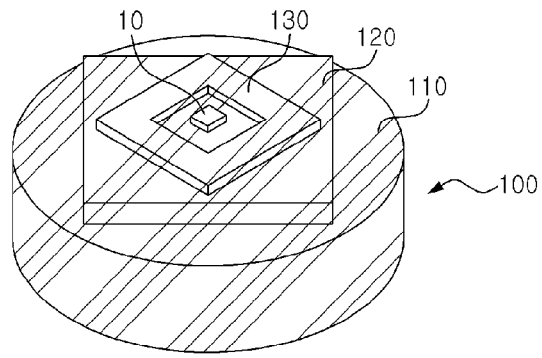
FIG. 1 is a perspective view showing a heat conducting slug having a multi-step structure according to one embodiment of the present invention.

Hereinafter, exemplary embodiments of the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art. Throughout the drawings, like reference numerals are used to designate like elements.

Figure 2:
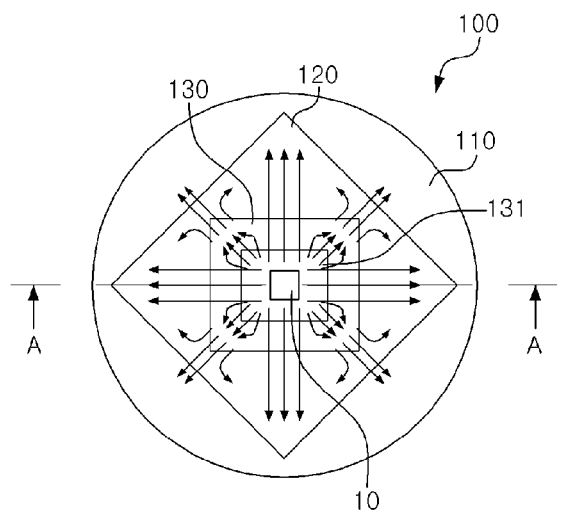
FIG. 2 is a plan view of FIG. 1.
Figure 3:
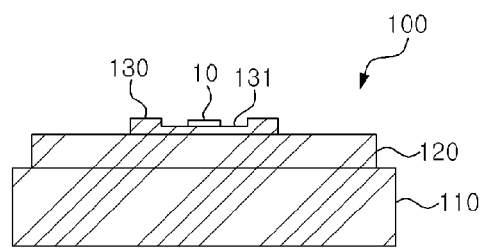
FIG. 3 is a sectional view taken along line A-A of FIG. 2.

FIG. 1 is a perspective view showing a heat conducting slug 100 having a multi-step structure according to one embodiment of the present invention, FIG. 2 is a plan view of FIG. 1, and FIG. 3 is a sectional view taken along line A-A of FIG. 2.

Referring to FIGS. 1 to 3, the heat conducting slug 100 having a multi-step structure according to one embodiment of the present invention includes a first slug 110, a second slug 120 arranged on the first slug 110, and a third slug 130 arranged on the second slug 120.

The first slug 110 has a cylindrical shape to be mounted in an LED package generally having a circular shape. The second slug 120 and the third slug 130 have a rectangular shape arranged to cross each other at 45 degrees so as to maximize a heat dissipation effect.

A light emitting chip 10 is mounted on the third slug 130.

The first slug 110, the second slug 120, and the third slug 130 are preferably made of material with high thermal conductivity. This material may have electric conductivity.

The first slug 110, the second slug 120, and the third slug 130 may be formed monolithically, or formed individually and then coupled with each other by means of a paste with high thermal conductivity.

The first slug 110 has a cylindrical shape with a circular rim. The second slug 120 and the third slug 130 may have rectangular rims, respectively.

At this time, the rectangular rim of the third slug 130 is preferably arranged within the rectangular rim of the second slug 120.

Here, the rectangular rim of the third slug 130 is arranged to cross the rectangular rim of the second slug 120, for example, to be rotated 45 degrees with respect thereto. When heat generated from the light emitting chip 10 mounted to the third slug 130 is dissipated to the second slug 120 through the third slug 130, the heat is most effectively dissipated if the rectangular rim of the third slug 130 is arranged to be rotated 45 degrees with respect to the rim of the second slug 120. However, the angle is not limited to 45 degrees.

In addition, the third slug 130 has a rectangular concave portion 131 formed at its center. The light emitting chip 10 is mounted in the concave portion 131. The shape of the concave portion 131 may be changed in various shapes such as circle or hexagon in addition to the rectangular shape.

Also, although a sidewall of the concave portion 131 is illustrated as being vertical, the sidewall of the concave portion 131 may be formed slantingly to form a reflective surface, so that the light emitted from the light emitting chip 10 or totally internally reflected from the surface of a molding member 400 is reflected on the sidewall and then emitted upward from the molding member 400.

Regarding the inclination of the sidewall of the concave portion 131 with respect to a bottom surface thereof, the sidewall is preferably inclined at 10 to 50 degrees with respect to the direction perpendicular to the bottom surface. However, an angle between the sidewall and the bottom surface is not limited thereto.

In addition, a reflective material may be formed on the bottom surface and the sidewall of the concave portion 131 to improve a light reflecting effect of the concave portion 131.

Referring to FIG. 2, it will be explained how the heat generated from the light emitting chip 10 is dissipated to the outside by the heat conducting slug 100 having a multi-step structure according to the embodiment of the present invention.

In order to improve a heat dissipation effect when designing the slug, a material with a high thermal conductive property may be used, or a heat dissipating area may be designed to be large.

Meanwhile, it is also possible to improve a structure of a slug so as to improve a heat dissipation effect. That is, due to the 2-dimensional shape of the slug, there may be a portion with high heat dissipation density and a portion with low heat dissipation density.

Generally, in an angled slug structure, heat dissipating to the center of edges tends to go straight, but heat in the other region tends to flow toward the corners.

In consideration of the above, the slug is configured to have a multi-step structure consisting of the first slug 110, the second slug 120, and the third slug 130, so that the heat gathered toward the corners of the third slug 130 is forcibly gathered toward the edges of the second slug 120, thereby improving a heat dissipation effect.

Thus, the heat generated from the light emitting chip 10 is transferred to the outside as indicated by arrows on the rectangular third slug 130. That is, in the angled slug structure, the heat dissipated to the center of edges tends to go straight, but heat in the other region tends to flow toward the corners.

Thus, in a case where the slug for heat dissipation has a rectangular shape, there is a phenomenon that heat is firstly gathered at the corners.

This phenomenon occurs even in the second slug 120. At a region where the third slug 130 and the second slug 120 are in contact with each other, the heat dissipated to the center of the edges of the second slug 120 tends to go straight, but the heat in the other region tends to flow toward corners. That is, since the second slug 120 for heat dissipation also has a rectangular shape, the heat is firstly gathered at the edge portions and then radiated out.

At this time, the rectangular rim of the second slug 120 is arranged with respect to the rectangular rim of the third slug 130 so that their edges are rotated 45 degrees with respect to each other.

Thus, the heat gathered toward the corners of the third slug 130 and then dissipated follows the heat dissipation path which causes the heat to be gathered again toward the edges of the second slug 120. In this way, the second slug 120 and the third slug 130 have a large heat dissipation area, thereby enhancing a heat dissipation effect.

Figure 4:
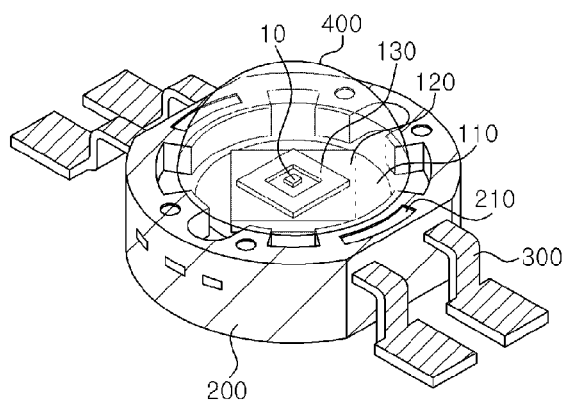
FIG. 4 is a perspective view showing an LED package using a heat conducting slug having a multi-step structure according to another embodiment of the present invention.

FIG. 4 is a perspective view showing an LED package using a heat conducting slug 100 having a multi-step structure according to another embodiment of the present invention.

Referring to FIG. 4, a first slug 110, a second slug 120, and a third slug 130 are mounted in a housing 200. Lead terminals 300 are installed to the housing 200.

The heat conducting slug 100 having a multi-step structure is mounted in the housing 200, and the light emitting chip 10 is mounted on the third slug 130. Thereafter, a molding member 400 is formed to encapsulate the light emitting chip 10 in the housing 200. At this time, the molding member 400 is formed convex to form a lens.

The housing 200, which is a body for supporting and protecting the entire structure of the LED package, may be made of an insulating material such as polyphthalamide (PPA) or liquid crystal polymer (LCP).

The housing 200 made of an insulating material supports and electrically disconnects the lead terminals 300 formed in the housing 200.

In this case, the housing 200 may have several grooves 210 in an upper portion of the housing 200 such that the grooves can be filled with a liquid resin leaking during a process for forming the molding member 400.

When the molding member 400 is formed using a separate mold (not shown), if the liquid resin injected into a mold leaks out due to its pressure, the grooves 210 formed here and there in the upper portion of the housing 200 allows the leaking liquid resin to be introduced into the grooves and not to overflow the housing. Thus, the grooves 210 are formed in the upper portion of the housing 200, which is in contact with the mold.

Meanwhile, although the groove 210 formed in the housing 200 of this embodiment is illustrated with a rectangular shape, the shape is not limited thereto. The groove may have a triangular or circular shape. That is, the groove 210 of this embodiment may have a semicircular, semi-oval or polygonal shape. In addition, in a case where two or more grooves 210 are formed in this embodiment, it is preferred that they be spaced apart from each other at regular intervals.

The lead terminals 300 are to apply external power to the light emitting chip 10, and are respectively formed on both sides of the housing 200. At this time, a part of the lead terminal 300 is inserted into the housing 200, and the other part protrudes out of the housing 200 to receive external power.

The light emitting chip 10, which has a compound semiconductor lamination structure with a p-n junction structure, uses a phenomenon in which light is emitted through recombination of minority carriers (electrons or holes). The light emitting chip 10 may include first and second semiconductor layers and an active layer formed therebetween. In this embodiment, the first semiconductor layer is a P-type semiconductor layer, and the second semiconductor layer is an N-type semiconductor layer. In addition, a P-type electrode is formed on an upper portion of the light emitting chip 10, i.e., on one surface of the P-type semiconductor layer, and an N-type electrode is formed on a lower portion of the light emitting chip 10, i.e., on one surface of the N-type semiconductor layer. At this time, the N-type electrode may be connected to one end of the lead frame 300, and the P-type electrode may be electrically connected to the other end of the lead frame 300 by wiring. However, the present invention is not limited thereto, but the light emitting chip 10 of the present invention may be a lateral light emitting chip instead of the aforementioned vertical light emitting chip. Various kinds of light emitting chips that emit visible rays or UV rays may also be used.

Meanwhile, the LED package according to the present invention may use a wire (not shown) to electrically connect the light emitting chip 10 to the lead frame 300.

The wire for electrically connecting the light emitting chip 10 to the lead frame 300 may be formed of gold (Au) or aluminum (Al) through a wire bonding process or the like.

The molding member 400 for encapsulating the light emitting chip 10 and fixing the wire connected to the light emitting chip 10 is formed using a predetermined mold. In addition, the molding member 400 may function as a lens to focus light emitted from the light emitting chip 10 as well as to encapsulate the light emitting chip 10 and fix the wire (not shown). Since this molding member 400 should transmit the light emitted from the light emitting chip 10 to the outside, it is generally made of a transparent resin such as epoxy resin or silicone resin.

At this time, a dispersion agent (not shown) may be further contained in the molding member 400 so as to scatter and disperse the light emitted from the light emitting chip 10 so that the light is uniformly emitted. Barium titanate, titanium oxide, aluminum oxide, silicon oxide and so on may be used as the dispersion agent. In addition, a phosphor (not shown) may be further contained in the molding member 400. The phosphor is used for absorbing a part of light emitted from the light emitting chip 10 and then emitting light with a different wavelength from the absorbed light. The phosphor comprises host lattice and activators which are impurities incorporated at proper positions. The activators serve to determine an energy level in a light emitting process, thereby determining the color of light emitted. The color is determined by an energy gap between ground and excitation states of the activators in a crystal structure.

Figure 5:
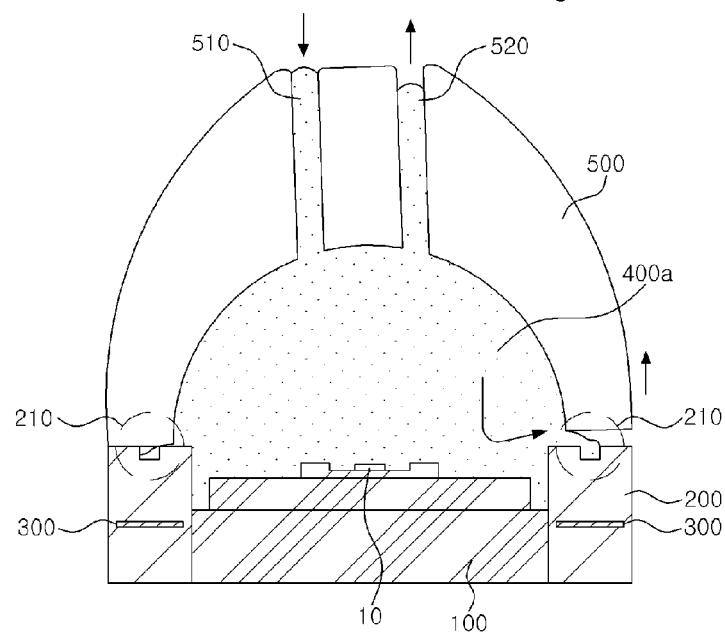
FIGS. 5 and 6 are sectional views illustrating a method for manufacturing the LED package according to the other embodiment of the present invention.
Figure 6:
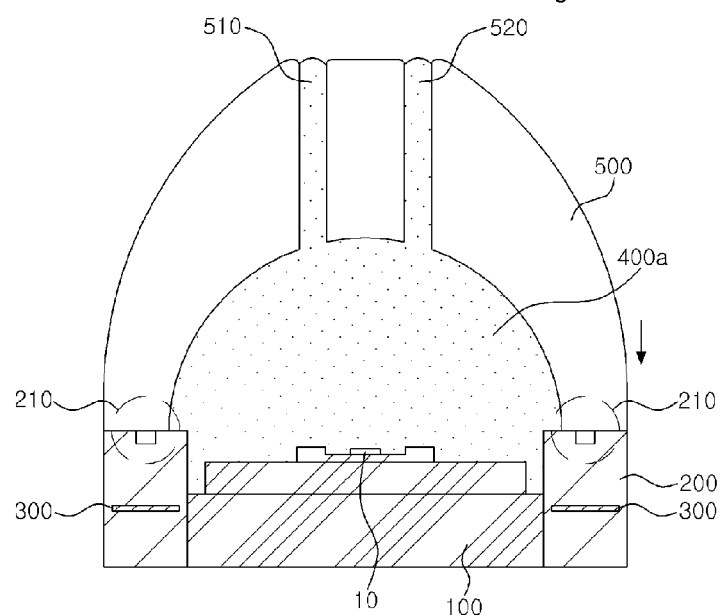

FIGS. 5 and 6 are sectional views illustrating a method for manufacturing the LED package according to the other embodiment of the present invention.

Here, it is assumed that pressure is abnormally increased at a partial area in the mold due to high pressure of the liquid resin when an LED package is made.

Referring to FIG. 5, firstly, the housing 200 having the lead terminals 300 are prepared.

The housing 200 may be made of an insulating material such as PPA or LCP in a liquid state by a molding process using a predetermined mold. That is, after a lead frame having the lead terminals 300 is formed by a separate pressing process, the lead frame is inserted into a mold so that the lead terminals 300 are partially inserted into the housing 200. Then, a liquid resin is injected into the mold and cured to thereby manufacture the housing 200. At this time, the predetermined mold is manufactured such that the groove 210 is formed in the housing 200. The groove 210 formed in the upper portion of the housing 200 may be formed on a region of the housing 200 where the housing 200 and the mold 500 used for forming the molding member 400 are in contact with each other, or an outside region of the mold 500, i.e., a region of the housing 200 where the molding member 400 is not formed. That is, the groove 210 is preferably formed on a periphery of a region in which the molding member 400 is formed, i.e., on a region other than the interior of the mold 500 with which the liquid resin is filled. More preferably, the groove 210 is formed on a region where the mold 500 and the housing 200 are in contact with each other.

Thereafter, the slug 100 having a multi-step structure is mounted in the housing 200. Then, the light emitting chip 10 separately prepared is mounted in the concave portion 131 of the third slug 130, and the light emitting chip 10 and the lead terminal 300 are connected through the wire (not shown).

The light emitting chip 10 is made by a semiconductor deposition or growth methods for forming a semiconductor layer on a substrate. This deposition or growth method may be selected from metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) or the like.

The light emitting chip 10 prepared as above is mounted to the concave portion 131 of the third slug 130 using an adhesive member (not shown) such as silver paste by means of a mounting apparatus, and the light emitting chip 10 and the lead terminal 300 may be electrically connected through a wire bonding process using a metal with excellent flexibility and electric conductivity such as gold (Au), silver (Ag) and aluminum (Al).

Then, a liquid resin is injected into the mold 500 so as to form the molding member 400 for encapsulating and protecting the light emitting chip 10 and the wire.

The molding member 400 may be formed by cast molding using the separate mold 500. If a liquid resin is injected into an injection hole 510 of the mold 500, the mold 500 is filled with the injected liquid resin 400a. If the mold 500 is completely filled up, the liquid resin 400a is discharged through a discharge hole 520 of the mold 500. At this time, in a case where an inner pressure of the mold 500 is increased over a certain level at a local area when the liquid resin 400a is injected at a high pressure, any one side of the mold 500 may be lifted up in an instant thereby making a gap between the mold 500 and the housing 200. If the liquid resin 400a with which the mold 500 is filled leaks out through the gap, the leaking liquid resin 400a flows into the groove 210 formed on the housing 200, and the inner pressure of the mold 500 is lowered as much as the amount of liquid resin 400a leaking from the mold 500.

Referring to FIG. 6, if the inner pressure of the mold 500 is lowered, the mold 500 is moved downward again and brought into close contact with the housing 200, so that the liquid resin 400a in the mold 500 does not flow out any more. Thereafter, the liquid resin 400a injected into the mold 500 is left alone at a predetermined temperature for a predetermined time to be cured, and then the mold 500 is removed. Then, unnecessary portions of the molding member 400 are ground to complete the light emitting device according to this embodiment.

In the LED package according to the present invention as mentioned above, the groove 210 is formed on the housing 200. Thus, even though the inner pressure of the mold 500 is higher than a normal level and the liquid resin 400a then leaks out of the mold 500 when the molding member 400 is formed by a cast molding method, the groove 210 is filled with the leaking liquid resin 400a, thereby lowering the inner pressure of the mold 500 and normally forming the molding member 400. In addition, the leaking liquid resin 400a is prevented form flowing down, thereby reducing a rate of failures of the LED package.

In this embodiment, it has been illustrated that the slug 100 is mounted to the housing 200 after the housing 200 is formed, but the present invention is not limited thereto. That is, the slug 100 may be mounted to a lead frame having the lead terminals 300, and then the housing 200 is formed thereon. In addition, it is possible that a first housing, which supports the lead terminals 300 and has a groove for receiving the slug 100, is formed, the slug 100 is mounted to the first housing, and then a second housing is formed to surround the lead terminals 300, the first housing and the slug 100. At this time, the housing 200 consists of the first and second housings.

Figure 7:
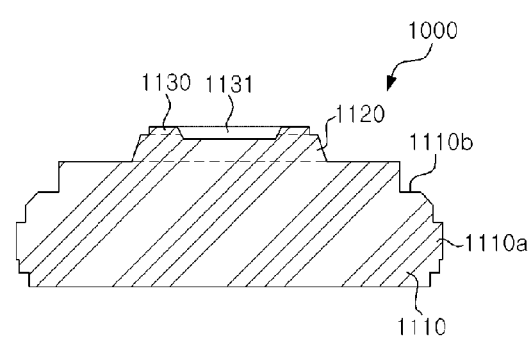
FIG. 7 is a sectional view showing a heat conducting slug having a multi-step structure according to a further embodiment of the present invention.

FIG. 7 is a sectional view showing a heat conducting slug 1000 having a multi-step structure according to a further embodiment of the present invention.

Referring to FIG. 7, a heat conducting slug 1000 includes a first slug 1110, a second slug 1120 arranged on the first slug 1110, and a third slug 1130 arranged on the second slug 1120.

The first slug 1110 has a cylindrical shape to be mounted in an LED package generally having a circular shape, as illustrated in FIG. 1. However, the first slug 1110 may have protrusions 1110a on its side in order not to be separated from a housing, and the protrusions may be formed continuously or discontinuously along a circumference of the first slug 1110. Meanwhile, the second slug 1120 and the third slug 1130 are respectively formed with edges, for example, to have rectangular rims, and the edges of them may be arranged to cross each other at 45 degrees so as to maximize a heat dissipation effect, as illustrated in FIG. 1.

In this embodiment, the first slug 1110, the second slug 1120, and the third slug 1130 are illustrated as being monolithically formed, but they may be prepared separately and then coupled with each other by means of a paste with high thermal conductivity.

In addition, the third slug 1130 may be formed with a rectangular concave portion 1131 at its center in a similar shape to its rim. The concave portion 1131 may also have a circular or hexagonal shape or other various shapes instead of the rectangular shape. In addition, the concave portion 1131 may be formed limitedly within the third slug 1130, but it may extend down to the second slug 1120, so that its bottom is positioned in the second slug 1120, as shown in the figure.

The concave portion 1131 may be formed slantingly to provide a reflective surface, as described above with respect to FIG. 1.

Meanwhile, a lead accepting step 1110b may be formed on a side of the first slug 1110. The lead accepting step 1110b is formed above the protrusion 1110a of the first slug 1110 and receives lead terminals and support leads, which will be described later. The lead accepting step 1110b may be formed continuously along the circumference of the first slug 1110. However, the lead accepting step 1110b is not limited thereto, but may be formed discontinuously.

Figure 8:
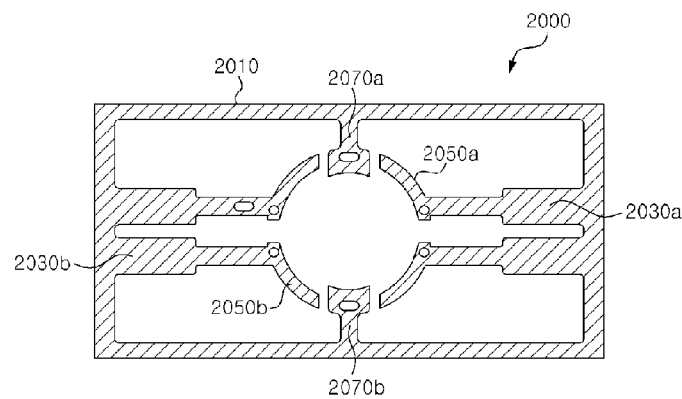
FIG. 8 is a plan view showing an example of a lead frame used for manufacturing the LED package of the present invention.

FIG. 8 is a plan view showing a lead frame 2000, as an example, used for manufacturing the LED package of the present invention.

Referring to FIG. 8, the lead frame 2000 includes an external frame 2010, lead terminals 2030a and 2030b, and support leads 2070a and 2070b.

The external frame 2010 surrounds and supports the lead terminals 2030a and 2030b and the support leads 2070a and 2070b. The lead terminals 2030a and 2030b may be formed symmetrically in pairs. The lead terminals 2030a and 2030b have inner leads 2050a and 2050b and outer leads 2030a and 2030b, respectively. Although it is illustrated in FIG. 8 that the inner leads 2050a are spaced apart from each other and the inner leads 2050b are spaced apart from each other, they may be connected with each other. The inner leads 2050a and 2050b may also extend along a predetermined circle to form a circular hollow, as shown in the figure.

Meanwhile, each of the support leads 2070a and 2070b has one end connected to the external frame 2010 and the other end extending into a region surrounded by the external frame 2010. The other ends of the support leads 2070a and 2070b extend into the hollow defined by the inner leads 2050a and 2050b. That is, the distance between the other ends of the support leads 2070a and 2070b is shorter than that between the inner leads 2050a and 2050b facing each other.

Figure 9:
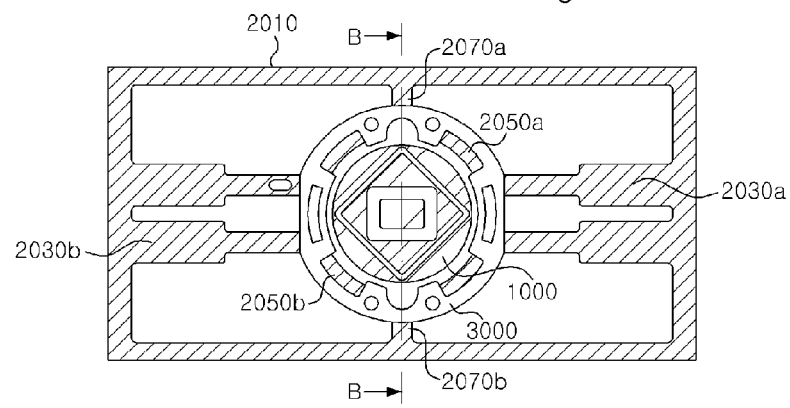
FIG. 9 is a plan view showing a state where a housing is formed on the lead frame of FIG. 8.
Figure 10:
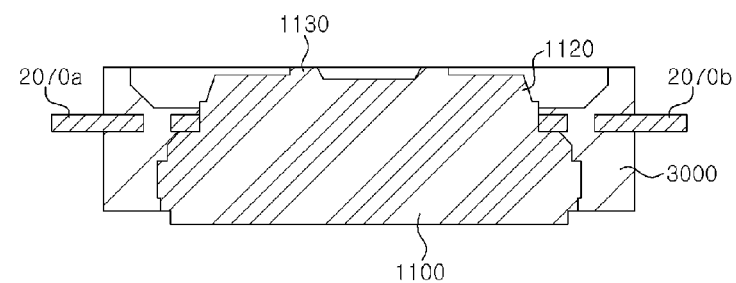
FIG. 10 is a sectional view taken along line B-B of FIG. 9.

FIG. 9 is a plan view showing a state where the heat sink 1000 is mounted to the lead frame 2000 and a housing 3000 is formed thereon, and FIG. 10 is a sectional view taken along line B-B of FIG. 9.

Referring to FIGS. 9 and 10, the ends of the support leads 2070a and 2070b are received in the lead accepting step 1110b (see FIG. 7) formed on the side of the first slug 1110, and then coupled to the slug 1000. Thus, the slug 1000 is supported and arranged by the support leads 2070a and 2070b.

Meanwhile, the inner leads 2050a and 2050b are arranged to be spaced apart from the slug 1000.

The housing 3000 may be formed by insertion molding, after the slug 1000 is mounted to the lead frame 2000. The housing 3000 supports the slug 1000 and the lead terminals 2030a and 2030b, and has an opening for exposing the upper surface of the slug 1000 and portions of the inner leads 2050a and 2050b.

Alternatively, it is also possible that a first housing is formed to support the support leads 2070a and 2070b and the inner leads 2050a and 2050b, and the slug 1000 is mounted to the first housing. At this time, the inner lead 2050a is coupled and electrically connected to the lead accepting step 1110b of the slug 1000. Thereafter, a second housing is formed to support the first housing, the inner leads 2050a and 2050b, and the slug 1000. At this time, the housing 3000 consists of the first and second housings.

Thereafter, a light emitting chip (not shown) is mounted in the concave portion 1131 formed on the third slug 1130 and electrically connected to the inner leads 2050a and 2050b by a wire, and then a molding member is formed. The external frame 2010 is removed during a packaging process, and the outer leads 2030a and 2030b are bent to complete an LED package. Unnecessary portions of the outer leads 2030a and 2030b may be removed.

According to this embodiment, the slug 1000 is supported using the support leads 2070a and 2070b, and then, the housing is formed by insertion molding. Thus, the slug 1000 and the lead frame 2000 may be aligned easily, and it is possible to prevent the arrangement from deviating during the packaging process. In addition, since the support leads 2070a and 2070b support the slug 1000, it is possible to prevent the slug 1000 from being separated from the housing 3000.

Figure 11:
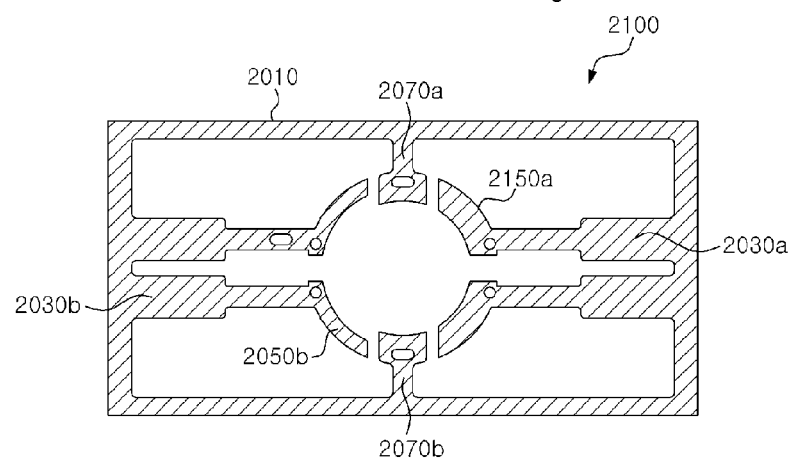
FIG. 11 shows another example of the lead frame used for manufacturing the LED package of the present invention.

FIG. 11 shows a lead frame 2100, as another example, used for manufacturing an LED package.

The lead frame 2100 of this embodiment is substantially identical to the lead frame 2000 shown in FIG. 8 except for modified inner leads 2150a.

That is, the inner leads 2150a and the inner leads 2050b are formed asymmetrically, and the inner leads 2150a are more inside of the hollow than the inner leads 2050b similarly to the other ends of the support leads 2070a and 2070b. In addition, the inner leads 2150a have a greater width than the inner leads 2050b, so that their outer peripheries may be symmetric with outer peripheries of the inner leads 2050b.

Here, it is illustrated that the inner leads 2150a are spaced apart from each other. However, the inner leads are not limited thereto, but may be connected to each other. In addition, the inner leads 2150a may be connected to the support leads 2070a and 2070b to form a semicircular ring.

Figure 12:
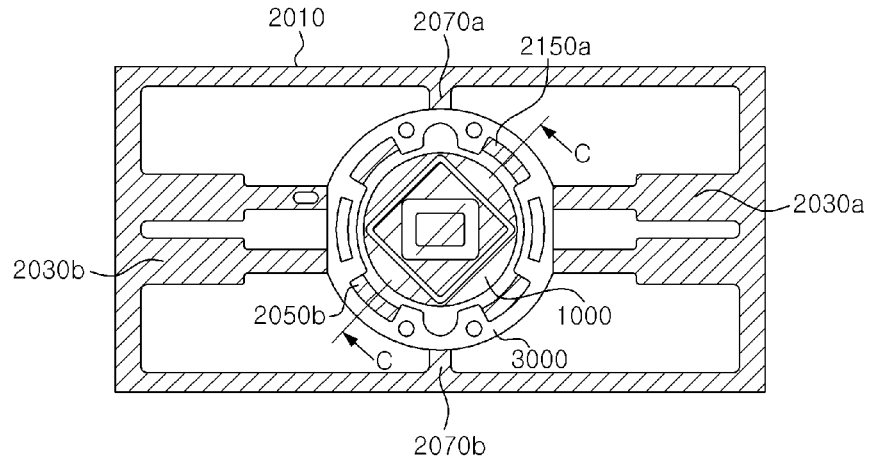
FIG. 12 is a plan view showing a state where a housing is formed on the lead frame of FIG. 11.
Figure 13:
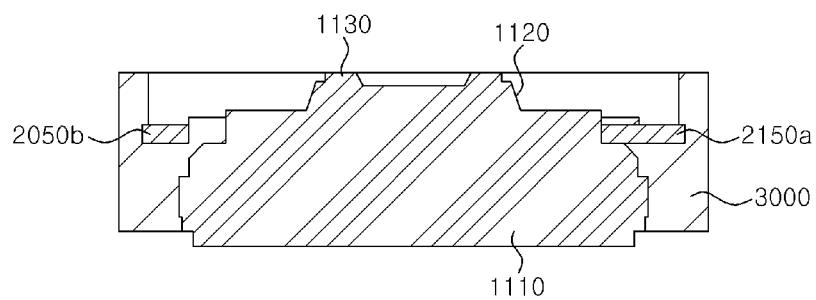
FIG. 13 is a sectional view taken along line C-C of FIG. 12.

FIG. 12 is a plan view showing a state where the slug 1000 is mounted to the lead frame 2100 and the housing 3000 is formed thereon, and FIG. 13 is a sectional view taken along line C-C of FIG. 12.

Referring to FIGS. 12 and 13, the ends of the support leads 2070a and 2070b are received in the lead accepting step 1110b (see FIG. 9) formed on the side of the first slug 1110 and then coupled to the slug 1000, as explained with reference to FIGS. 9 and 10. In addition, the inner leads 2150a are received in the lead accepting step 1110b and coupled to the slug 1000. Meanwhile, the inner leads 2050b are spaced apart from the slug 1000.

In addition, a process for forming the housing 3000 and package is performed in the same manner as described above with reference to FIGS. 9 and 10, thereby completing an LED package.

According to this embodiment, the inner leads 2150a are coupled and electrically connected to the slug 1000. Thus, in a case where a vertical light emitting chip (not shown) is mounted to the slug 1000 using a conductive adhesive, there is no need to electrically connect the light emitting chip and the inner leads 2150a by wiring or using a wire. Thus, the wiring process becomes simpler, and package failures caused by disconnection of wire can be decreased since a wire is excluded.

Figure 14:
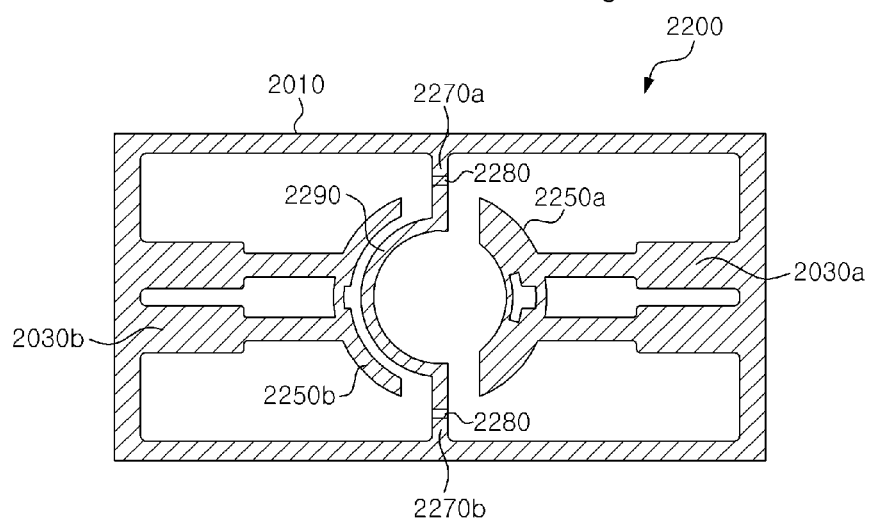
FIG. 14 is a plan view showing a further example of the lead frame used for manufacturing the LED package of the present invention.

FIG. 14 is a plan view showing a lead frame 2200, as a further example, used for manufacturing the LED package of the present invention.

Referring to FIG. 14, the lead frame 2200 includes an external frame 2010 and outer leads 2030a and 2030b, as explained with reference to FIG. 7. Meanwhile, inner leads 2250a and 2250b are connected to the outer leads 2030a and 2030b, and support leads 2270a and 2270b extend from the external frame 2010.

The support leads 2270a and 2270b are connected with each other to form a semicircular support ring 2290, and also define a circular hollow together with the inner leads 2250a. That is, the semicircular support ring 2290 is arranged to face the inner leads 2250a. The support leads 2270a and 2270b and the inner leads 2250a are then coupled to the lead accepting step 1110b (see FIG. 7) to support the slug 1000 (see FIG. 7).

In addition, the semicircular support ring 2290 formed by extension of the support leads 2270a and 2270b may be connected with the inner leads 2250a, thereby forming a circular ring in connection with the inner leads 2250a.

Meanwhile, the inner leads 2250b are arranged out of the support ring 2290, and the inner leads 2250b are separated from the slug 1000 when the slug 1000 is mounted to the lead frame 2200.

It is illustrated in this embodiment that the inner leads 2250a are connected with each other to form a single inner lead. However, the present invention is not limited thereto, and the inner leads may be spaced apart from each other like the inner leads 2150a of FIG. 11. In addition, although it is illustrated that the inner leads 2250b are connected with each other to form a single inner lead, the present invention is not limited thereto. The inner leads may be spaced apart from each other like the inner leads 2050b of FIG. 11.

According to this embodiment, the support leads 2270a and 2270b may be connected with each other to form the semicircular support ring 2290, and the semicircular support ring 2290 and the inner leads 2250a may be coupled to the slug 1000, thereby supporting the slug 1000 more securely.

Meanwhile, partially cutaway portions 2280 may be previously formed at predetermined portions of the support leads 2270a and 2270b to be positioned in the housing 3000 so that ends of the support leads 2270a and 2270b remaining out of the housing 3000 may be easily removed.

Although the present invention has been explained with reference to the drawings and embodiments, it will be understood by those skilled in the art that various changes and modifications can be made thereto within the scope without departing from the technical spirit of the present invention defined by the appended claims.

The invention claimed is:

1. A heat conducting slug for dissipating heat from a light emitting chip disposed thereon, the heat conducting slug comprising:
a first slug;
a second slug disposed on the first slug; and
a third slug disposed on the second slug opposite to the first slug such that the second slug is disposed between the first slug and the third slug,
wherein the second slug and the third slug are respectively shaped to have edges, and the edges of the second slug and the edges of the third slug are arranged to cross each other,
wherein the second slug is entirely disposed within the perimeter of the first slug, and
wherein heat from the light emitting chip is configured to flow through the third slug to the second slug and then the first slug.

2. The heat conducting slug of claim 1, wherein each of the second slug and the third slug has a rectangular rim, the rectangular rim of the third slug is positioned within the rectangular rim of the second slug, and the rectangular rim of the third slug is arranged to be rotated 45 degrees with respect to the rectangular rim of the second slug.

3. The heat conducting slug of claim 2, wherein the third slug comprises a concave portion configured to receive a light emitting chip.

4. The heat conducting slug of claim 3, wherein the third slug further comprises a reflective surface on the concave portion.

5. The heat conducting slug of claim 1, wherein the first slug, the second slug, and the third slug are monolithically formed.

6. The heat conducting slug of claim 5, wherein the third slug comprises a concave portion configured to receive a light emitting chip, and the concave portion extends to the second slug, whereby a bottom surface of the concave portion is positioned within the second slug.

7. The heat conducting slug of claim 5, wherein the first slug has a lead accepting step configured to be coupled to lead terminals.

8. The heat conducting slug of claim 7, wherein the lead accepting step is continuously formed along a circumference of the first slug.

9. The heat conducting slug of claim 1, wherein the second slug is disposed directly on the first slug.

10. The heat conducting slug of claim 1, wherein the third slug is disposed directly on the second slug.

11. A light emitting diode (LED) package, comprising:
a housing;
a heat conducting slug mounted in the housing;
a light emitting chip disposed on the heat conducting slug; and
lead terminals, wherein the heat conducting slug has a multi-step structure comprising a first slug; a second slug disposed on the first slug; and a third slug disposed on the second slug opposite to the first slug such that the second slug is disposed between the first slug and the third slug, the second slug and the third slug being respectively shaped to have edges, the edges of the second slug and the edges of the third slug being arranged to cross each other, wherein the second slug is entirely disposed within the perimeter of the first slug, wherein the light emitting chip is disposed on the third slug opposite to the second slug, and wherein the first slug comprises a bottom surface exposed outside of the housing.

12. The LED package of claim 11, wherein the second slug and the third slug has a rectangular rim, the rectangular rim of the third slug is positioned within the rectangular rim of the second slug, and the rectangular rim of the third slug is arranged to be rotated 45 degrees with respect to the rectangular rim of the second slug.

13. The LED package of in claim 12, wherein the third slug comprises a concave portion configured to receive a light emitting chip.

14. The LED package of claim 11, wherein the first slug, the second slug, and the third slug are monolithically formed.

15. The LED package of claim 14, wherein the third slug comprises a concave portion configured to receive the light emitting chip, and the concave portion extends to the second slug, whereby a bottom surface of the concave portion is positioned within the second slug.

16. The LED package of claim 14, further comprising support leads, wherein the support leads are coupled to the heat conducting slug.

17. The LED package of claim 16, wherein the first slug has a lead accepting step, and the support leads are coupled to the lead accepting step.

18. The LED package of claim 16, wherein at least one of the lead terminals is coupled and electrically connected to the heat conducting slug, and at least another one of the lead terminals is spaced apart from the heat conducting slug.

19. The LED package of claim 18, wherein at least one of the lead terminals is coupled to the lead accepting step of the first slug.

20. The LED package of claim 18, wherein at least one of the lead terminals and ends of the support leads are connected with each other to form a semicircular ring.

21. The LED package of claim 18, wherein the support leads extend to form a semicircular support ring coupled to the first slug along a circumference of the first slug, and the semicircular support ring is arranged to face at least one of the lead terminals.

22. The LED package of claim 11, wherein at least one groove is formed on an upper portion of the housing.

23. The LED package of claim 11, wherein the second slug is disposed directly on the first slug.

24. The LED package of claim 11, wherein the third slug is disposed directly on the second slug.

25. A light emitting diode (LED) package, comprising:
a housing;
a heat conducting slug mounted in the housing;
a light emitting chip disposed on the heat conducting slug;
at least two lead terminals; and
support leads coupled to the housing,
wherein at least one of the lead terminals is coupled and electrically connected to the heat conducting slug, and at least another one of the lead terminals is spaced apart from the heat conducting slug, the support leads extending to be connected to each other and form a semicircular support ring coupled to the heat conducting slug, the heat conducting slug being arranged between the semicircular support ring and the lead terminal coupled to the heat conducting slug, and
wherein the semicircular support ring is disposed between the at least one lead terminal coupled to the heat conducting slug and the at least another one lead terminal spaced apart from the heat conducting slug.

26. The LED package of claim 25, wherein the semicircular support ring and the lead terminal coupled to the heat conducting slug are connected with each other to form a circular ring.

* * * * *